United States Patent [19]

Anger

[11] 3,976,987
[45] Aug. 24, 1976

[54] DUAL CHANNEL DYNAMIC LINE ISOLATION MONITOR

[75] Inventor: Ernest G. Anger, Wauwatosa, Wis.

[73] Assignee: Square D Company, Park Ridge, Ill.

[22] Filed: Aug. 29, 1975

[21] Appl. No.: 609,002

[52] U.S. Cl. .......................... 340/255; 317/18 R; 324/51
[51] Int. Cl.² .................................. G08B 21/00
[58] Field of Search ............... 340/255; 317/18 R; 324/51

[56] References Cited
UNITED STATES PATENTS

| | | | |
|---|---|---|---|
| 3,579,219 | 5/1971 | Wolfframm | 340/255 |
| 3,666,993 | 5/1972 | Legatti | 317/18 R |
| 3,668,472 | 6/1972 | Shields | 317/18 R |
| 3,696,366 | 10/1972 | Parsons | 340/255 |
| 3,699,392 | 10/1972 | Lee et al. | 317/18 R |
| 3,700,966 | 10/1972 | Morrow | 340/255 X |
| 3,710,238 | 1/1973 | Peterson | 324/51 |
| 3,737,765 | 6/1973 | Lee et al. | 324/51 |
| 3,754,221 | 8/1973 | Stelter | 340/255 |
| 3,757,169 | 9/1973 | Beresnikow | 317/18 R |
| 3,868,665 | 2/1975 | Treglown | 340/255 |

Primary Examiner—John W. Caldwell
Assistant Examiner—Daniel Myer
Attorney, Agent, or Firm—Neuman, Williams, Anderson & Olson

[57] ABSTRACT

A line isolation monitor for indicating the maximum hazard current in an ungrounded power distribution system with conductor lines having leakage impedances. A signal proportional to the maximum voltage to ground of any of the conductor lines in the system is determined and used as a reference voltage for the monitor. Separate circuits each responsive to the reference voltage generate respectively a capacitive component signal and a resistive component signal which are combined and applied as a measurement signal across the system leakage impedances in parallel. The impedance voltage response to the measurement current is separated from the line voltage signal, phase shifted and compared to the reference voltage signal to produce a difference signal which is used to control the magnitude of both the capacitive component signal and the resistive component signal. The magnitude of the combined capacitive component signal and the resistive component signal represents the maximum hazard current.

25 Claims, 9 Drawing Figures

DUAL CHANNEL DYNAMIC LINE ISOLATION MONITOR

BACKGROUND OF THE INVENTION

The present invention relates to a monitor for use with an ungrounded power distribution system. The monitor detects any decrease in the completeness of the system's isolation from ground by indicating the magnitude of current that would pass through a grounded low impedance connected to a system conductor due to the existence of either balanced or unbalanced resistive, capacitive or hybrid system leakages.

Isolated ungrounded power distribution systems are required under the standards set forth by the National Fire Protection Association Publication, No. 56(a)—1971, which is part of the National Electric Code, Article 517, in hospital rooms where anesthetic is administered such as operating rooms and special purpose rooms where electronic devices are attached to the patient e.g., cardiovascular laboratories. Furthermore, the standards require that a monitor be used with such ungrounded systems to provide continuous indication that the system remains safely isolated from ground. The present invention is a dynamic line isolation monitor, LIM, specifically adapted for use in hospital ungrounded power supply systems.

In an ideal isolated ungrounded system, there is infinite impedance to ground so that if a direct low impedance connection were made between any conductor and ground no current will flow through the low impedance. However, all isolated ungrounded electrical distribution systems experience a certain amount of leakage to ground. Paths of resistive leakage or faults are caused by the fact that no insulator is perfect and insulation deteriorates with age and use. Paths of capacitive leakage or faults, the more severe problem, are inherently present in all systems and increase with the length of the wire conductors. Both types of leakages increase with the number of user devices connected to the system. Naturally, any supply conductor may have a combination of both resistive and capacitive leakage paths to ground. These leakages in an actual isolated ungrounded system provide a path to ground and if a grounded low impedance were connected to a conductor the current, now having a return path due to the leakages, would flow through the low impedance. The total current that would flow through a low impedance if it were connected between an isolated conductor and ground is defined as a hazard current. The fault hazard current is defined as the hazard current of a given isolated system with all user devices connected except the line isolation monitor. The monitor hazard current is defined as the amount of hazard current due solely to the connection of the monitor to the ungrounded supply system. The total hazard current is the combination of the fault hazard current caused by electrical devices connected to the isolated system plus the monitored hazard current due to the monitoring device connected to the isolated system. The NFPA standards require that if the total hazard current exceeds a predetermined value, a red light and audible warning alarm be energized. Furthermore, the standards limit the amount of monitor hazard current contributed by the LIM to the total hazard current.

One reason for the NFPA standards is the safety of the patient. If the normal high body resistance of a patient is in any way bypassed then he becomes electrically susceptible. The degree of electrical susceptibility can vary depending on the medical procedure being followed. If the procedure requires that the patient have an electric probe or catheter connected directly to the heart muscle, the electrical susceptibility is at a maximum and a small amount of current passing through the patient is extremely dangerous. The electrical susceptibility of the patient is reduced if the medical procedure only requires electrodes connected to the outer skin after a conductive paste has been applied to the point of contact.

In either situation if the human body forms a low impedance due to the bypassing of its normally high resistance and then forms a connection between a line conductor and ground, the total hazard current will flow through the body due to the return path formed by the leakage or faults in the system. Alternating current passing through the human body with a magnitude exceeding 2 milliamperes may produce extreme shock and possibly death. The line isolated monitor used with an ungrounded isolated power distribution system in a hospital continuously indicates the worst or maximum total hazard current that would flow through the human body in such a condition.

Prior art monitors include the static ground detector which utilized a low value resistance placed between one side of the conductor and ground or simply a balanced static bridge circuit which detected any unbalanced impedance condition between the lines. The primary difficulty with this type of static detector was its failure to detect simultaneously occurring connections of resistive or capacitive leakages to ground on each conductor. Prior art dynamic ground detectors overcame the static detectors insensibility to unbalanced faults. The prior art dynamic detector is connected at predetermined intervals between each conductor of the supply and ground to determine the current flow in the detector path. If this current exceeded a predetermined magnitude, the detector indicates an unsafe grounding condition. These types of dynamic line monitors or ground detectors contribute a high amount of monitor hazard current to the total hazard current, produce large spikes in the conductor line and introduce noise interference due to the alternate and periodic connection of the detector to one line and then to the other.

SUMMARY OF THE INVENTION

The present invention indicates the maximum total hazard current by the use of circuitry connected across the two conductors, in a two wire ungrounded isolated power distribution system. A detector circuit produces a DC reference voltage which is proportional to the maximum voltage to ground of either supply line conductor and which is used as a driving voltage to produce a measuring current. The reference voltage is applied to commutated integrators in both a capacitive component current measurement channel and a resistive component current measurement channel. The voltage reference signal is compared in the feedback path of an operational amplifier in each channel to a subsequently generated impedance voltage feedback signal and the difference between the two signals is used as an error signal input to the operational amplifier functioning as an integrator whose output voltage represents the accumulative error signal. The frequency of the output signals is then increased to a higher nonharmonically related frequency compared to the line frequency. These separately generated resistive and capacitive current components are summed at the ratio to properly compensate for the different system leakage impedance at the higher measurement current frequency. This measurement current is applied to the system leakage impedances in parallel to produce the impedance voltage. The impedance voltage thus produced is separated from the line frequency voltage, phase advanced by 45° and applied to both the resistive and capacitive component current measurement channels. The phase advanced impedance voltage signal is demodulated in the respective component channels and applied as the feedback signal for comparison with the voltage reference signal. Based upon this comparison, the capacitive and resistive component signals are continuously varied in magnitude. The summed components form the measurement current signal which varies in magnitude and phase until it produces an impedance voltage at the proper phase and which is proportionally equal to the maximum voltage to ground of either supply line. In a separate circuit branch, the direct output of both the capacitive and resistive component channels are summed on a one-to-one ratio and applied to a measurement circuit means which is calibrated to indicate the measurement current times the same proportional constant used in developing the equality between the impedance voltage and the reference voltage. The meter circuit means therefor indicate the maximum hazard current.

The addition of the LIM to the supply system produces a negligible monitor hazard current under the NFPA standards in the preferred embodiment less than 30 microamperes. The line isolation monitor also uses an audible alarm in addition to the visual indication on the meter. The audible alarm is actuated in the event of loss of either of the ground connections, one for the line isolation monitor, and one for the indicating meter. A test button provides for the checking of proper leakage detection without addition to the system hazard by applying an internal test leakage while temporarily disconnecting the LIM from the monitored power distribution system. Additional remote indicating meters, lights, and test buttons can be connected to the LIM if desired.

An object of the present invention is to provide a line isolation monitor with a low monitor hazard current.

A further object is to reduce the alarm current range necessary to detect combinations of resistive and capacitive faults the impedance of which varies in magnitude and phase angle.

An additional object is to provide a continuous two channel line isolation monitor which eliminates the noise and interference caused by the periodic switching and measuring of each line impedance to ground.

An additional object is to provide a line isolation monitor which determines the maximum total hazard current by applying into the system an adjustable measurement current of a frequency different than the line current to produce a voltage across the parallel combination of all leakage impedances which is proportionally equal to the maximum line to ground voltage.

An additional object is to provide a feedback signal to adjust a capacitive component of the measurement current and a resistive component of the measurement current each generated in separate channels and combined to form the measurement current signal.

An additional object is to adjust the magnitude and phase of the measurement current produced in response to a signal generated by comparing in the feedback path of an operational amplifier the signal representing the maximum line voltage to ground to the leakage impedance voltage produced in response to the measurement current flowing in the parallel combination of all leakage impedance.

Further objects and advantages of the present invention will become apparent from consideration of the detailed description when taken in conjunction with the accompanying drawings.

THEORY OF OPERATION

To understand the basis for the circuitry of the present invention, an appreciation of the theory of operation is necessary. The total hazard current of a two-wire ungrounded isolated electrical supply system is the maximum amount of current that would flow through a grounded object in contact with either of the live conductors. In the ideal ungrounded isolated power distribution system, with infinite impedance to ground, no current will flow through a grounded object contacting any of the live conductors regardless of the voltage carried between the supply conductors since there is no return path from ground. However, in all practical systems, there are system leakage paths to ground or faults. The leakage paths can be either resistive, capacitive, or a combination of resistive and capacitive in nature and can be balanced, the same on each line, or unbalanced. In this practical system, if a grounded object contacts one of the live conductors, the system leakages to ground provide a return path for the current flow and therefor the system possesses a hazard current.

The hazard current of either line is the value of the current that would pass through a grounded conducting object connected to the line and is determined to be the supply voltage $V_S$ (line-to-line voltage) divided by the leakage to ground impedance value of the opposite line. Therefore, in a two-wire ungrounded isolated electrical distribution system, the hazard current $I_{H1}$ of line L1, if it were grounded, is equal to the supply voltage $V_S$ divided by the leakage impedance $Z_2$ in line L2. Similarly, the hazard current $I_{H2}$ of line L2, if it were grounded, is equal to the supply voltage $V_S$ divided by the leakage impedance $Z_1$ of the line L1, $$I_{H1} \ (\text{if } L_1 \text{ grounded}) = \frac{V_S}{Z_2} \qquad (1)$$

$$I_{H2} \ (\text{if } L_2 \text{ grounded}) = \frac{V_S}{Z_1} \qquad (2)$$

The individual leakages to ground of a supply line can consist of any combination of resistive and capacitive impedances connected in parallel. The total leakage impedance of the line is the composite vector impedance $Z_0$ of the individual parallel leakage impedance. Then the sum of the leakages to ground of the respective supply line conductors L1 and L2 can be combined into two composite vector admittances quantities $Y_1$ and $Y_2$. The total leakage to ground impedances of each line are respectively in series connection between the isolated supplied voltage $V_S$ with their junction at ground and the conductor lines to which they are respectively connected will float at voltages to ground vectorially related such that the ratio, $$\frac{V_1}{V_2} = \frac{Y_2}{Y_1} \quad (3)$$

where $V_1$ is the magnitude of the voltage to ground of supply line L1 and $V_2$ is the magnitude of the voltage to ground of supply line L2. The vector sum of $V_1$ and $V_2$ equals the isolated supply voltage $v_S$. Therefore, each supply line conductor has a value of hazard current equal to the magnitude of the supply voltage $V_S$ multiplied by the leakage admittance of the opposite line, so that, $$I_{H1} \text{ (If } L_1 \text{ grounded)} = V_S \cdot Y_2 \quad (4)$$

$$I_{H2} \text{ (If } L_2 \text{ grounded)} = V_S \cdot Y_1 \quad (5)$$

The conductor line having the greatest hazard current will be the line with the smaller leakage to ground admittance and the higher voltage to ground since its hazard current will be determined by the larger leakage to ground admittance of the opposite conductor line multiplied by the supply voltage difference between the lines.

It is important to provide a line isolation monitor which has a small monior hazard current and therefore, does not significantly increase the total hazard current. To directly measure the total leakage impedances of each supply line would require either open circuiting the conductors or test grounding each conductor in turn, either of these procedures greatly increases the amount of hazard to the patient. In accordance with the teaching of the present invention to total leakages to ground equals the parallel combination of the leakage to ground admittance of $L_1$ and $L_2$, so that, $Y_0 = Y_1 + Y_2$. The total admittance value $Y_0$ can be determined by introducing a small measurement current into either or both of the line conductors $L_1$ or $L_2$ through a high impedance source in the line isolation monitor. The measurement current $I_M$ will flow through the parallel combination of all leakage to ground impedances in contrast to the supply leakage current due to the supply voltage which flows through them in series. The floating voltage levels of either conductor line to ground can be simply measured. The voltage change in the voltage to ground measured in either conductor line is defined as $\Delta V$ and the total leakage admittance of the system is $Y_0$ so that: $Y_0 = I_M/\Delta V$. The relation of the floating line voltages of the conductors to their admittance is $Y_1 \cdot V_1 = Y_2 \cdot V_2$.

Based upon the above relationships, the separate conductor line hazard currents can be defined as functions of voltages and the total admittance so:

$$I_{H1} = (V_1 + V_2) \cdot Y_2 = V_1 \cdot Y_2 + V_1 \cdot Y_1 = V_1 \cdot (Y_2 + Y_1)$$
$$= V_1 \cdot Y_0 \quad (7)$$

$$I_{H2} = (V_1 + V_2) \cdot Y_1 = V_2 \cdot Y_2 + V_2 \cdot Y_1 = V_2 \cdot (Y_2 + Y_1)$$
$$= V_2 \cdot Y_0 \quad (8)$$

The maximum hazard current that would be present in either conductor line is therefore a simple function of the maximum conductor to ground voltage and total leakage admittance so:

$$I_H \text{ max.} = (V \text{ max.}) \cdot Y_0 \quad (9)$$

The measurement test current $I_M$ is controlled so that $\Delta V$, the change in voltage to ground in either of the conductor lines due to the measurement current maintains a fixed proportion K to the maximum voltage to ground in either line so that:

$$\Delta V = K \cdot (V \text{ max.}) \quad (10)$$

if $K$ is expressed as a fraction, the magnitude of the measurement current will be proportional to the maximum hazard current following the relation:

$$I_M = \Delta V \cdot Y_0 = K \cdot (V \text{ max.}) \cdot Y_0 = K \cdot I_H \text{ max.} \quad (11)$$

Thus the relation is based on the same constant value $K$ as used to make the change in line conductor voltage $\Delta V$ equal to the maximum line voltage. The combined admittance $Y_0$ is determined by using a measurement current of very small magnitude since the capacitive and resistive leakages to ground admittance have linear characteristics. The very small magnitude current does not disturb the supply or appreciably increase the system hazard current.

In the preferred embodiment, the measurement current has a frequency different from the supply current by a multiple to permit detection of the small voltage change $\Delta V$ which is superimposed on the much greater supply line voltages $V_1$ and $V_2$. The 60 Hertz supply frequency voltage signal can be removed by filtering and the small voltage $\Delta V$ produced in response to the measurement current flow through the systems leakage impedances detected. While the use of a different and preferably higher frequency measurement current permits the measurement of the small voltage change $\Delta V$, it requires compensation of the change in the leading phase component of capacitive admittance at measurement current frequency. Therefore the capacitive component of the measurement current must be separately generated and applied in a ratio equal to the measurement frequency $f_M$ divided by the line frequency $f_0$. The capacitive component of the test current is therefor combined at a ratio equal to $f_M/f_0$ with the separately generated resistive component of the measurement current to form the total measurement current $I_M$ which is then applied to either line conductor.

The maximum hazard current is indicated on a meter which is calibrated to reflect the proportionality constant $K$. However, the capacitive component of the measurement current is summed with the resistive component on a one-to-one ratio to produce a proper indication of maximum line frequency hazard current in the meter.

The above analysis is simply the measurement of the magnitude of a current that is necessary to produce a small fractional voltage change in the maximum voltage to ground of either supply line conductor so that the small voltage change multiplied by a proportionality constant will equal the maximum voltage to ground and the magnitude of the current multiplied by the same proportionality constant will predict the maximum hazard current which would occur if the conductor line with the maximum voltage to ground were connected to a grounded low impedance. The fault current or hazard current can be predicted for any point in a network of linear impedance elements by measuring the voltage existing at that point due to the normal sources in the network and dividing that value by the value of the impedance to ground which is measured at that point by use of a separate measurement current source with all normal sources in the network short circuited. This application of the Thevinen theorem is accomplished by the instant invention without disrupting the line frequency voltages present in the system or appreciably increasing the hazard current by determining the voltage produced in the leakage impedance by a known but different frequency current than the supply current.

GENERAL SYSTEM OPERATION

Figure 1:
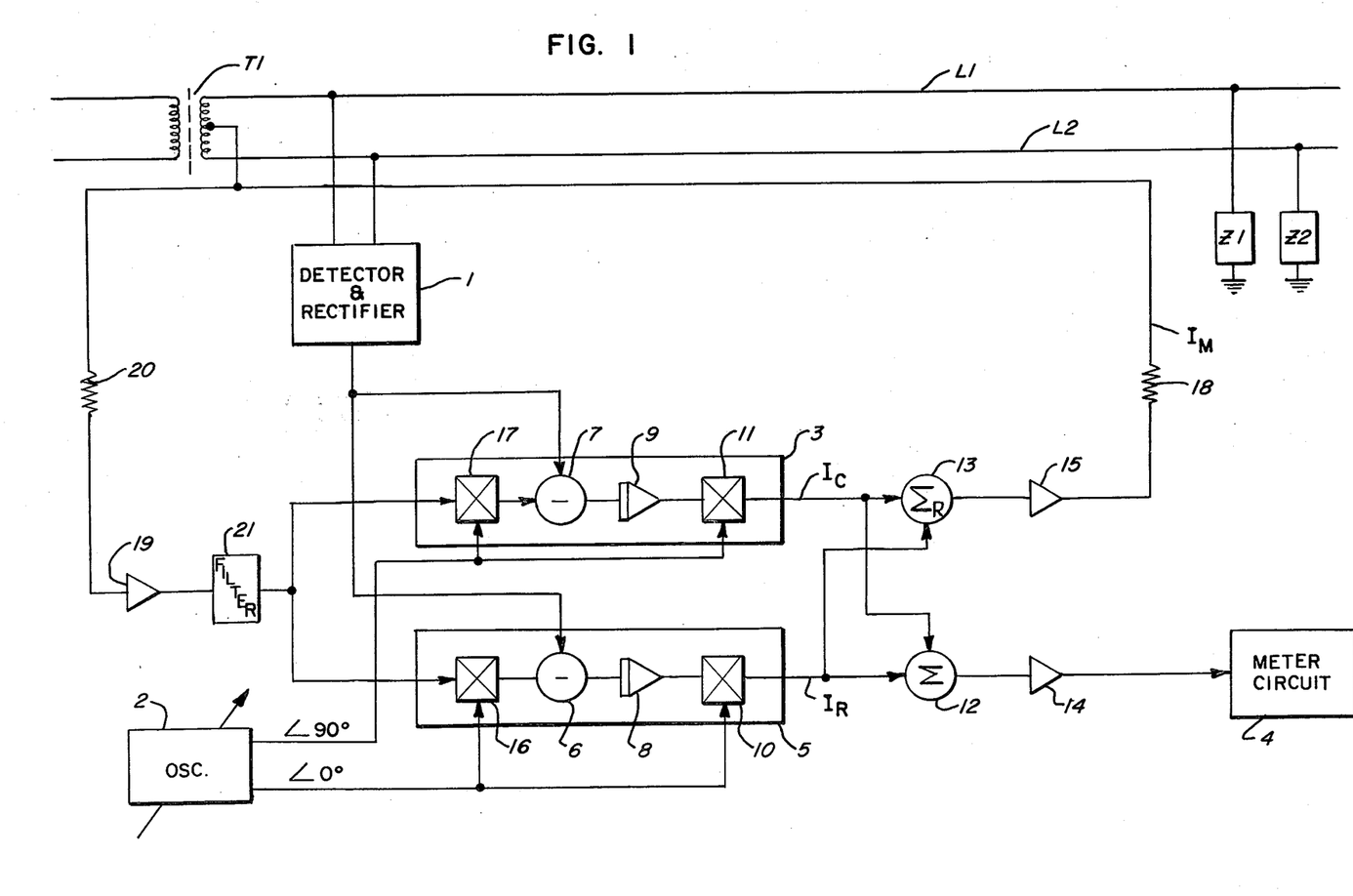
FIG. 1 is a functional block diagram illustrating the theory of operation of the invention.

The theoretical operation of the system is illustrated in the functional block diagram of FIG. 1. An ungrounded isolated power supply system is illustrated comprising two conductors L1 and L2 connected to the secondary of the isolated, shielded or separated power transformer T1. It should be apparent that the monitor can be connected to more than two conductors in a multiwire or a polyphase system. Connected to line L1 and line L2 respectfully are the impedances Z1 and Z2. These impedances represent the parallel combination of the capacitive and resistive leakages to ground present in any actual system. Leads from lines L1 and L2 are connected as inputs to the LIM and specifically the maximum voltage detector and rectifier means 1. The output of detector 1 is a DC reference voltage V ref. representative of the maximum voltage to ground of line L1 or line L2. The DC reference voltage V ref. is used as the driving voltage to initiate operation of the rest of the LIM and is applied as an input signal to both the capacitive component current measurement channel 3 and the resistive component current measurement channel 5. In the capacitive channel 3, the driving voltage V ref. is supplied to comparator circuit 7. At this time, V ref. is the only signal that is applied to the subtractive comparator circuit 7 since no feedback signal has yet been developed. Therefore, the comparator produces an output signal equal to the V ref. and applies this DC signal to the input of integrator 9. The integrator 9 is a DC accumulating amplifier with a high time delayed gain and with an output range sufficient to force, through the measurement feedback process, the summation of its inputs to near zero. The integrator 9 will produce a continuing increase in its output signal as long as there is a signal at its input. The output signal is thereby a DC signal representing the accumulated magnitude of the input signal over a time period. The output of the integrator 9 is applied as the input to multiplier circuit 11. The multiplier may be either a linear modulator-demodulator or a nonlinear chopper, commutator or other gating device. Also applied to the multiplier 11 is a 152 Hertz voltage signal with a 90° leading phase angle supplied from two-phase clock oscillator circuit 2. The output of multiplier 11 is an alternating current signal $I_C$ representing the capacitive component of the measurement current $I_M$.

The circuit elements of the resistive channel 5 are identical to those described in the capacitive channel 3. The DC reference voltage from detector 1 is also applied as an input to the resistive component current measurement channel 5. The DC voltage is specifically applied as an input to comparator circuit 6. At this point of time the voltage reference V ref. is the only input to comparator 6, and appears as the output. This signal is applied as the input to integrator 8. The integrator will provide an output signal as long as there is a voltage input signal. The output of integrator 8 is applied as an input signal to multiplier 10. The multiplier 10 has a clock input signal from the two-phase clock oscillator 2. The clock signal to multiplier 10 from the two-phase clock oscillator 2 is a 152 Hertz voltage signal at 0° phase. Thus, the clocking signals from oscillator circuit 2 applied to the capacitive channel 3 and the resistive channel 5 are in quadrature phase. The output of the multiplier 10 is an alternating current signal representative of the resistive component $I_R$ of the measurement current $I_M$.

The capacitive component generated by channel 3 and the resistive component generated by channel 5 are combined in summation circuit 13 with the capacitive component being increased at a ratio of the frequency $f_M$ of the clocking oscillator 2 divided by the frequency $f_0$ of the supply line to correct for the higher capacitive leakage to ground impedance due to the 152 Hertz test measurement current as compared to the 60 Hertz supply line current which would be present in actual supply current leakage. The output of the summation circuit 13 is the frequency compensated combination of the capacitive component from channel 3 and the resistive component from channel 5. The output of the summation circuit is sent through amplifier 15 with a gain of A. The output of amplifier 15 is applied to the large resistor 18 to produce the test current $I_M$ which is equal to the gain A of the amplifier 15 times the resistive component plus the capacitive component. Therefore, in complex vector notation, $$I_M = A \left( I_R + j \frac{f_M}{f_0} I_C \right) \qquad (12)$$

where $j$ indicates a phase lead of 90°. The measurement current $I_M$ being compensated for its higher frequency will produce an impedance voltage $V_Z$ in magnitude and phase equivalent to a lower frequency line current. Thus, the subsequent direct summation of the output of the capacitive and resistive channels will provide an indication of the maximum line frequency hazard current. The measurement current $I_M$ is applied to any point in the supply system. The measurement current $I_M$ flows in parallel through all of the systems leakage-to-ground impedances.

Applied to the input of amplifier 19, across the high resistor 20, is the 60 cycle supply line signal plus the signal representing the voltage $V_Z$ due to the flow of compensated current $I_M$ through the parallel leakage to ground impedances in the supply line system. The amplifier 19 has a gain B and its output is supplied as the input to filter 21. Filter 21 filters out the 60 cycle input voltage signal and in passing the 152 cycle voltage input signal phase advances the signal by 45°. Therefore, the signal at the output of filter 21 is $B \cdot V_Z \angle 45°$. This signal is applied as an input to both the capacitor component measurement current channel 3 and the resistive component measurement current channel 5. In the capacitive channel, the signal is specifically applied as an input to a multiplier 17 functioning as a demodulator with the clocking input from two-phase clock oscillator circuit 2 being a 152 Hertz frequency signal at a 90° leading phase angle. The DC output of demodulator 17 is applied as a feedback input to comparator 7. The other input to comparator 7 is the DC voltage reference V ref. from detector means 1 derived as explained above. The difference between the two input voltages will now provide a capacitive error signal. This error signal is the input to integrator 9. As long as integrator 9 has a nonzero input, the capacitive component of the measurement current will vary in magnitude tending to reduce that error towards zero.

The output of filter 21 is also applied to the resistive component measuring circuit channel 5 and in particular a multiplier 16 operating as a demodulator. The demodulating input is obtained from the two phase clock oscillator and is a signal of 152 Hertz at 0° phase angle. The DC output of demodulator 16 is applied as an input to comparator 6. The other input to comparator 6 is the DC voltage V ref. The difference between the two input voltages will now provide a resistive error signal applied as an input to integrator 8. As long as there is a nonzero input signal to integrator 8, the resistive component of the measurement current will vary with similarly correcting effect as described regarding the capacitive component. Thus the compensated measurement current which is applied to the leakage impedances in parallel will vary in both magnitude and phase until it produces an impedance voltage $V_Z$ at the proper phase and which is proportionally equal to the DC reference voltage. When the voltage $V_Z$ which results from the application of the compensated measurement current $I_M$ to the system leakage impedances in parallel proportionally equals the DC reference voltage V ref. the direct summation of the resistive component $I_R$ and the capacitive component $I_C$ will be representative of the maximum hazard current. The output of the capacitive and the resistive component measurement current channels are summed in summation circuit 12. The output of summation circuit 12 is the current $I_R + j I_C$. This signal is applied to an amplifier 14 with a gain C. The output of the amplifier circuit 14 is applied to a measurement circuit 4 including a rectifying diode and hazard current meter (not illustrated). The measurement circuit is calibrated to multiply the uncompensated measurement current by the fixed proportionality constant by which the impedance voltage $V_Z$ equals the maximum supply voltage to ground. Thus, the meter indicates the maximum total hazard current.

Figure 2:
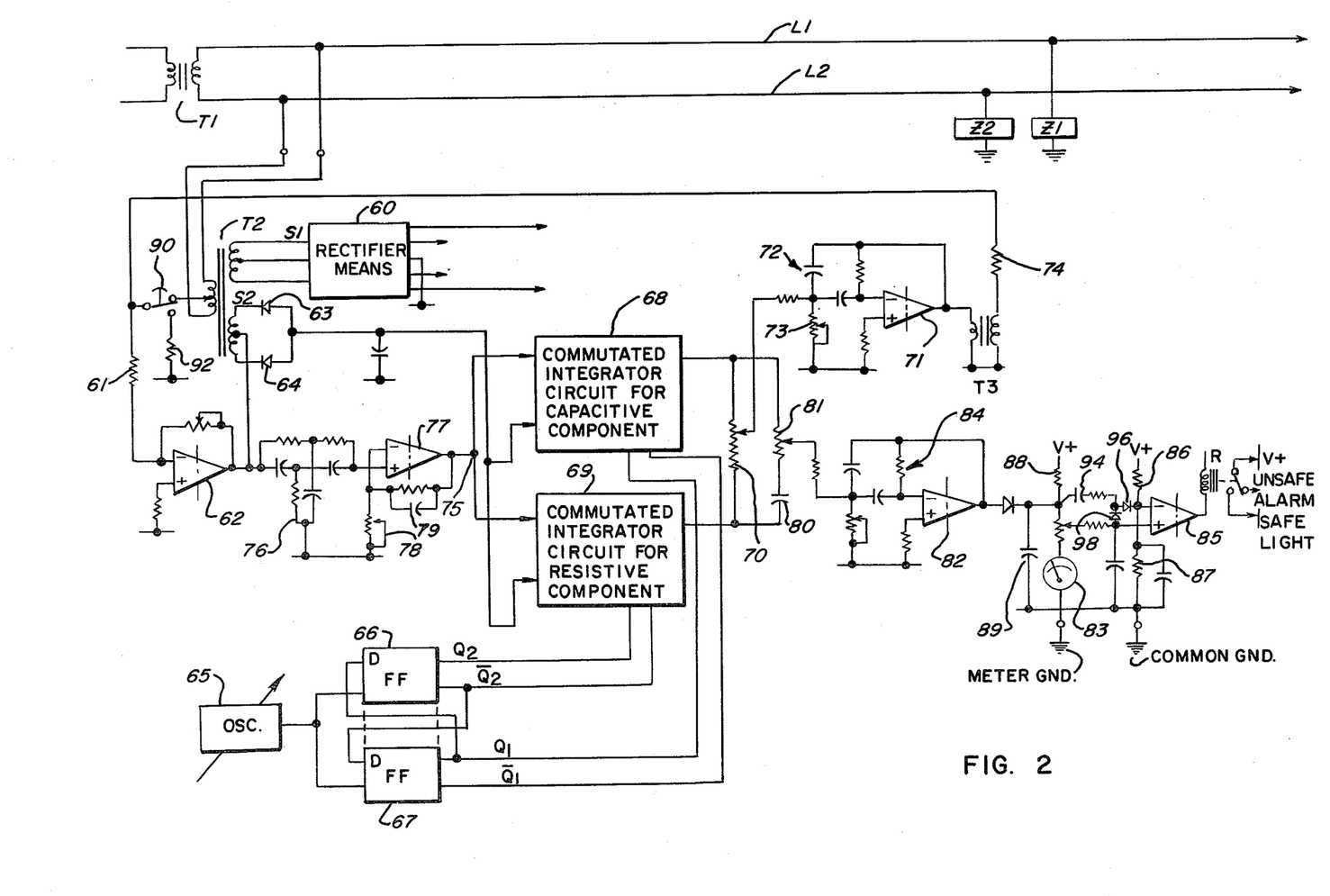
FIG. 2 is a schematic diagram illustrating the preferred embodiment of the invention.

It should be apparent that other connections from lines L1 and L2 to the detector means 1 are possible, such as illustrated in FIG. 2. Furthermore, it should be apparent that when the system consists of more than two line conductors to be monitored, similar arrangements of proportionally related secondary windings can be used. For example, in a three phase monitor, an additional small single phase transformer with a ⅓ secondary tap in Scott connection can furnish the required secondary voltages. It should also be noted that the choice of the measurement frequency signal could be lower, equal to or higher than the line frequency signal.

DETAILED DESCRIPTION

FIG. 2 is a detailed schematic of the preferred embodiment line isolation monitor of the present invention. In this embodiment the standard resistors, capacitors and biasing networks obvious to one of ordinary skill in the art have not been illustrated. The incoming power is applied to an isolating supply transformer T1 comprising a primary and secondary winding. The ungrounded conductor lines L1 and L2 are connected to user equipment (not illustrated). The resistive and capacitive leakages to ground present in the isolated ungrounded power distribution system are represented diagramatically by the impedance Z1 from line L1 to ground and impedance Z2 from line L2 to ground. The impedances Z1 and Z2 represent any combination of resistive and/or capacitive leakages in parallel of the respective supply lines. The LIM will detect the maximum hazard current due to balanced or unbalanced resistive, capacitive or hybrid leakages. A center tapped supply transformer T2 for the line isolation monitor is connected across lines L1 and L2. The internal transformer T2 is of small physical size and contributes negligible resistive and capacitive leakage to ground. The transformer T2 has two secondary windings S1 and S2. The secondary S1 is connected to a supply rectifier circuit means 60. The rectifier means 60 generates DC voltages for use in the system for the amplifier and gate circuits. The rectifier means 60 which generates these DC voltages can be of any standard design well-known in the art and is not further described herein.

The isolated ungrounded supply conductor L1 has a voltage to ground V1 and the supply conductor L2 has a voltage to ground V2. As described under Theory of Operation, the maximum hazard current will be measured in the line having the largest voltage to ground and therefore the greater of the two voltages V1 and V2 must be determined. A DC reference voltage V ref. proportional to the largest voltage to ground present in the lines L1 and L1 is subsequently used as a driving voltage to produce the test measurement current. To obtain the driving voltage V ref. for the two-wire system of FIG. 2. The monitor transformer T2 has a center tapped secondary winding S2, each half having a ratio of 1 to 12 of the primary and the center tap of the primary for transformer T2 provides connections for the high value resistor 61 to the input of operational amplifier 62.

It should be noted that the tap connections to the primary and secondary of T2 are preferably center taps to minimize the range of voltage magnitudes, although any proportionally related taps could be used. Also, it should be noted that a center tapped secondary for the main power transformer T1 could be used instead of the LIM transformer T2. The operational amplifier 62 has a voltage gain of one-twelfth (1/12) and its output is connected to the center tap of the secondary S2. The output of the amplifier 62 is combined with the opposite polarity voltages of the secondary S2. The greater of the resulting combined voltages is selectively rectified by diode 63 or 64 to produce a DC voltage reference proportionally equal to the maximum voltage to ground of lines L1 and L2.

It should be noted that this preferred embodiment illustrated in FIG. 2 eliminates the need for the separate connections from the lines L1 and L2 to the detector and rectifier means as in FIG. 1. The preferred embodiment reduces the number of LIM connections to the power distribution system and consequently reduces the monitor hazard current. Also, it permits the utilization of rectifying elements with less stringent voltage and leakage specifications.

As explained in Theory of Operation, the vector ratio of the two leakage to ground impedances Z1 and Z2 determines the respective line to ground voltages V1 and V2. These voltages must maintain a vector sum equal to the supply voltage $V_S$, commonly 120 volts and 60 Hertz, across the primary winding of the LIM transformer T2. The resulting voltage displacement of the center tap connection of the primary is transmitted in a reduced ratio $1/r$, in the preferred embodiment $r = 12$. The amplifier 62 with a voltage gain of 1/12 has its output combined with the opposite polarity voltages of secondary winding S2, for example, each equal to 5 volts, one-twelfth of the 60 volts center tap to line voltages at the primary of transformer T2. The voltages V1' and V2' from the center tap of secondary S2 to each line are equal to the floating voltages V1 and V2 of the supply lines to ground reduced in the scale of 1 to 12. The selective rectification of the greater of the voltages V1' or V2' produces the DC reference voltage V ref. This DC reference voltage represents in the reduced scale of 1 to 12 the maximum voltage to ground in either supply line L1 or L2. The magnitude of the DC reference voltage V ref. will vary with the ratio of connected leakage to ground impedances from a minimum of approximately one-half the supply voltage times $1/r$ or 60 volts divided by 12 with matched leakages on the line to twice that value, 10 volts, with single line leakage and to various intermediate values with either unequal leakages or with equal but dissimilar leakages. It should be noted that the voltage reference produced measures only the ratio of impedances, the inverse ratio of their admittances and in the following examples, hypothetical values of leakage impedance are assumed and the resulting voltage reference developed. In the actual operation of the line isolation monitor, the individual link leakage impedance values are unknown and the LIM must respond using only the measurement of the 60 Hertz floating voltage and the sensing of composite leakage impedance using the 152 Hertz frequency signal.

The operation of the above circuit with some typical 2 ma. leakage hazards is illustrated in the following examples.

Figure 5:
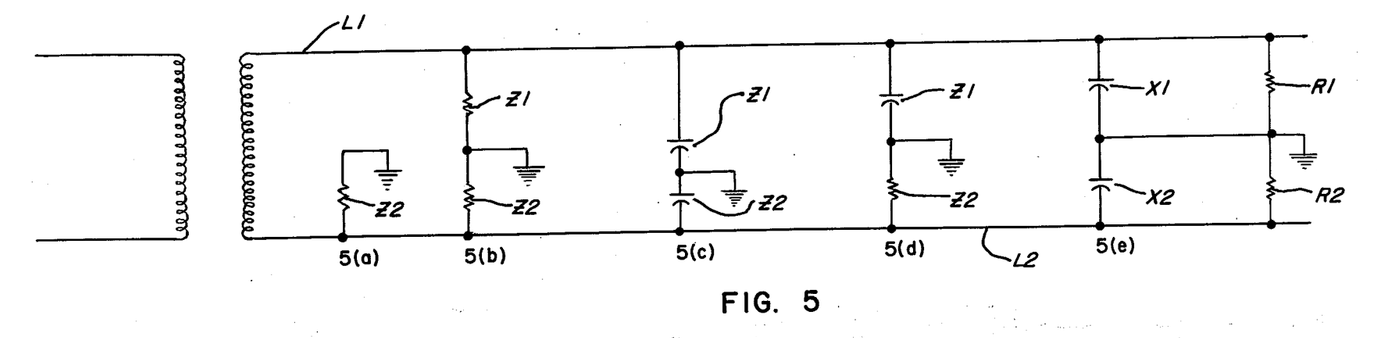
FIGS. 5(a) through 5(e) illustrate various types of impedance leakages.

If, as illustrated in FIG. 5(a), an unbalanced single resistive leakage connects line L2 to ground and this impedance Z2 is equal to 60K ohms then the total impedance $Z_0$ is equal to 60K ohms. Now, the voltage to ground V1 on line L1 equals 120 volts and the voltage to ground V2 on line L2 is equal to zero volts since that line is grounded. The output of the amplifier 62 reflects the 60 volt displacement of the voltage at the center tap of the primary transformer T2 and produces through a gain of 1 to 12 a 5 volt output signal. The 5 volt output signal of amplifier 62 is supplied to the center tap of the secondary S2 providing a five volt addition to the voltage V1' and a 5 volt reduction to the voltage V2'. The rectified DC reference voltage V ref. then developed through diode 63 only is at the maximum value of 10 volts. The maximum hazard current to be measured by the monitor will then be 10 volts divided by 60K ohm and multiplied by $r = 12$ to yield the 2 milliampere hazard value for the single 60K ohm resistor with 120 volt supply.

If as illustrated in FIG. 5(b) balanced dual resistive leakage impedances exist where $Z1 = 60K$ ohms and $Z2 = 60K$ ohms then their parallel combination $Z_0 = 30$ K ohms. The voltage V1 from line L1 to ground is equal to 60 volts. The voltage at the center tap of the primary of transformer T2 reflecting the balanced condition is zero volts and the output of amplifier 62 is zero volts. The output of the amplifier 62 is applied to the center tap of the secondary of transformer T2 but does not add or subtract from the opposite polarity voltages V1' and V2'. The diodes 63 and 64 rectify either voltage V1' or V2' and produce the voltage reference V ref. equal to one-half of the maximum value or 5 volts. The same result would occur if balanced dual capacitive leakages were present on lines L1 and L2. In either the balanced resistive or capacitive situation the monitor will measure a maximum hazard current equal to the 5 volt reference divided by the 30K ohm value of $Z_0$ times $r = 12$, which is the 2 milliampere hazard of each of the lines.

If as illustrated in FIG. 5(c) there are unbalanced dual capacitive leakages such that $Z1 = -j$ 120K ohms and $Z2 = -j$ 60K ohms, then $Z_0 = 40K$ ohms at an angle of $-90°$. The voltage V1 from line L1 to ground is equal to 80 volts and the voltage V2 from line L2 to ground equals 40 volts and the voltage displacement at the center tap of the primary transistor T2 is 20 volts. The output of amplifier 62 with a gain of 1 to 12 is 1.67 volts which is added to the opposite polarity voltages across the secondary of transformer S2 producing a voltage V1' = 6.67 volts and voltage V2' = 3.33 volts. The DC voltage reference V ref. from the rectification of diode 63 only will equal 6.67 volts. The maximum hazard current indicated by the monitor will be 6.67 volts divided by 40K ohms times $r$, which measures the greater 2 milliampere hazard appearing on line L1 due to impedance Z2.

If there is an unbalanced dissimilar leakage impedance as illustrated in FIG. 5(d) where the resistive impedance is less that the capacitive impedance and Z1 = $-j$ 60K ohms, and $Z_2 = 64K$ ohms, then $Z_0 = 44K$ ohms at an angle of $-48°$. The voltage V1 to ground is equal to 82 volts and the voltage V2 to ground equals 88 volts and the voltage displacement at the center tap of the primary of transformer T2 is an out-of-phase vector of 60 volts at an angle of $-93°$. The output of the amplifier 62 would then be 5 volts at an angle $-93°$ and when applied to the center tap of the secondary S2 transformer T2 provides vector values of V1' and V2' both higher than for simple inphase balance of similar leakages. The rectified DC reference voltage V ref. equals 7.3 volts. The indicated monitor hazard current will now be 7.3 volts divided by 44K ohms times $r$ or the 2 milliampere hazard at L2 due to impedance Z1.

If an unbalanced hybrid leakage is present on lines L1 and L2 as illustrated in FIG. 5(e) and the leakages of line L1 are $R1 = 69.3K$ ohms, capacitive $X1 = -j$ 120K ohms and the leakages of line L2 are $R2 = 240K$ ohms, capacitive $X2 = -j$ 138.6K ohms the calculation of relevant values are as follows:

system admittance:

$$Y_1 = \frac{1}{R_1} + \frac{1}{X_1} = 16.7 \cdot 10^{-6} \angle 60°, \text{mhos}$$

$$Y_2 = \frac{1}{R_2} + \frac{1}{X_2} = 8.33 \cdot 10^{-6} \angle 30°, \text{mhos}$$

and the parallel combination of admittances:

$$Y_0 = Y_1 + Y_2 = 24.2 \cdot 10^{-6} \angle 40°, \text{mhos}$$

and the parallel combination of impedances $$Z_0 = \frac{1}{Y_0} = 41.3 \angle -40°K \text{ ohms}$$

and $$Z_1 = \frac{1}{Y_1} = 60K \angle -60° \text{ ohms}$$

$$Z_2 = \frac{1}{Y_2} = 120K \angle -30° \text{ ohms}$$

so that the series impedance:

$$Z_1 + Z_2 = 175K \angle -40° \text{ ohms}$$

and the series leakage current $$I_S = \frac{V_S}{Z_1 + Z_2} = .687 \angle 40° \text{ ma}$$

now, the voltage to ground of line L1:

$$V_1 = Z_1 I_S = 41.3 \angle -20° \text{ volts}$$

and the voltage to ground of line L2:

$$V_2 = Z_2 I_S = 82.6 \angle 10° \text{ volts}$$

so that the voltage to ground of line L2 is the maximum and the vector combination of $V_1 + V_2 = V_S = 120$ volts, so, the displacement voltage at the center tapa of tap primary of tranformer T2:

$$V_N = 60V - V_1 = 25.5 \ V \angle -124°$$

The voltage output of amplifier 62 is an out-of-phase vector which produces vector values V1' and V2' both higher than simple inphase balance of similar leakages and yields an intermediate value of V ref. equal to 6.9 volts. The indicated monitor hazard current will now be 6.9 volts divided by 41.3K ohms times $r$, which is the 2 milliampere hazard appearing at line L2 due to the lower leakage impedance of line L1. These computations illustrate that the V ref. is a proportional relation to the maximum voltage to ground of line L1 and L2 and can be derived from a single tap from the supply lines despite the complexity of the leakage impedance.

The DC reference voltage V ref. is used as the driving voltage in the remainder of the line isolation monitor to generate a measurement current $I_M$. The voltage reference signal V ref. is applied to the commutating integrator circuits 68 and 69 in the capacitive component current channel and the resistive component current channel.

Figure 3:
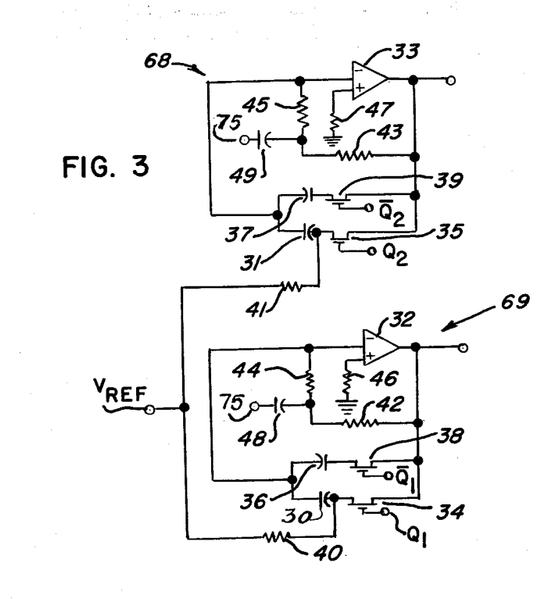
FIG. 3 is a schematic diagram of the commutated integrator circuits of FIG. 2.
Figure 4:
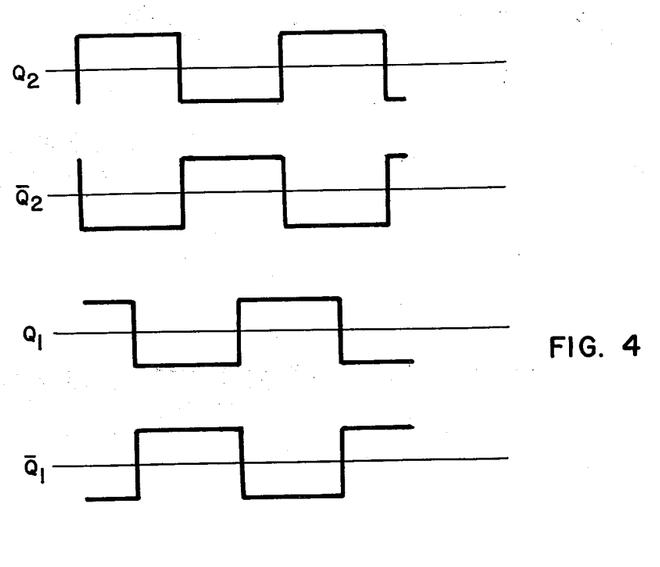
FIG. 4 illustrates the quadrature wave form input to the commutated integrator circuits.

Referring to FIG. 3, each of the commutated integrator circuits 68 and 69 perform the four functions described in connection with each of the channels 3 and 5 of FIG. 1 precisely, the commutation of the DC reference to produce quadrature related signals, discrimination between the two separate phase feedback components, synchronous filtering to remove supply harmonic components from the feedback signals and automatic regulation of each channel's output signal to a value which produces precise balance of the AC feedback component amplitude to that of the DC reference. The DC voltage reference signal V ref. is applied through resistor 41 to begin charging the capacitor 31 in the feedback path of operational amplifier 33. In the embodiment shown, the voltage reference signal is of negative magnitude although positive polarity could be used so that capacitor 31 begins to charge negatively when switch element 35 is open. At the same instant, the capacitor 31 is charging the oppositely connected parallel capacitor 37 also in the feedback path of operational amplifier 33, begins to charge to the opposite but equal magnitude by DC feedback reaction of the amplifier 33 through resistors 43 and 45 which constrain the amplifier 33 to regulate DC output unbalances to zero. The noninverting input of amplifier 33 is connected to the common ground through resistor 47. In the resistive component channel, the voltage reference signal produces a similar charging of capacitors 30 and 36. The signal to gate the stored DC voltages on the capacitors 30, 36 and 31, 37 is produced by an adjustable oscillator 6 of 608 Hertz frequency which is connected to the flip-flops 66 and 67 as in FIG. 2. The flip-flops 66 and 67 have cross-connected "D" steering inputs to furnish, by interlocked countdown of the 608 Hertz frequency clock signal from oscillator 65 four square wave signals of 152 Hertz as in FIG. 4. The 152 Hertz frequency is selected since it is sufficiently different from that of the supply for effective detection and slightly higher than the integral 5:2 ratio of the line frequency (60 Hertz), so that sustained error due to synchronous detection of unwanted stray 60 Hertz coupling is prevented. Thus, any error due to the 60 Hertz coupling will produce a dither oscillation which is later filtered out in the LIM meter circuit. It should be noted that other measurement frequencies could be used with filters which provide the necessary 45° phase advance, to be later explained, which is automatically provided by the selected measurement frequency and simple filters as used in the circuit. These output signals of flip-flops 66 and 67 maintain a quadrature relationship such the $Q_1$ and $\overline{Q}_2$ (its inversion) lead and overlap $Q_2$ and $\overline{Q}_2$ by precisely 90° as illustrated in FIG. 4. These two signal pairs are applied to gate synchronously timed conduction of the associated switch elements 35, 39 and 34, 38. This synchronous commutation process in the feedback path of the operational amplifiers 33 and 32 substantially eliminates noise coupling inherent in standard multiplexers and present even if the commutation occurs at the inputs of low level amplifiers using special quality FET chopper transistors. The alternate connection of operational amplifiers 33 and 32 to feedback capacitors 31, 37 and 30, 36 cause the amplifiers to produce square wave AC output amplitudes equal to the magnitude of the DC accumulated charge voltages. However, at this point in time no feedback signal is applied through coupling capacitors 49 and 48, only the voltage V ref. is applied to charge the feedback capacitors so the output of the operational amplifiers 33 and 32 is a square wave AC output with an amplitude equal to the DC accumulated voltage.

The operational amplifiers 33 and 32 as illustrated in FIG. 3 thus operate in identical matched circuits as commutated integrators to generate AC voltages synchronized by the timing signal furnished from flip-flops 66 and 67, and to determine capacitive and resistive components respectively of the 152 Hertz test current to be used for measurement of the line leakages to ground admittance. The relative output magnitudes of the operational amplifier 33 and 32 will be compensated to directly reflect the different relative values of the resistive and capacitive current components at 60 Hertz so that their vectoral combination can then provide a direct measure of the predicted fault current at the line frequency for the greater voltage to ground of either line conductor. The AC output of operational amplifier 33 is a square wave produced by the alternate connection of oppositely charged capacitors 31 and 37 in its feedback network and the output of operational amplifier 32 is similarly controlled by the complementary alternate connection of the alternately charged capacitors 30 and 36 in its feedback path. The only difference in the AC output of the two operational amplifiers is in the relative timing of their commutation and in the amplitudes they reach. The staggered time sequence provided in the alternate conduction of the associated pairs of switch elements 35, 39 and 34, 38 causes the alternation of amplifier 33 output to lead that of amplifier 32 in phase by precisely 90° while both maintain the same 152 Hertz frequency. This provides a necessary timing relation so that the output of operational amplifier 33 can control leading phase capacitive leakage current while the output of amplifier 32 can control only resistive leakage and their respective output magnitudes provide separate measurements of these component current leakage failures.

The square wave output voltages of the commutated integrator circuits 68 and 69 are combined in the summation circuit 70 to produce a composite 152 Hertz signal. In order for the AC amplitudes of the outputs of operational amplifiers 33 and 32 at a 152 Hertz to directly provide measurements of leakage components in the system at the line frequency of 60 Hertz, the phase leading output of operational amplifier 33 in commutated integrator 68 is transmitted at an increased ratio as compared to that of operational amplifier 32 in commutated integrator 69 to provide the proportionally larger leading phase component of 152 Hertz measurement current required by capacitive components of the system leakage impedance to produce a voltage feedback of a magnitude and phase value that would reflect the 60 Hertz line frequency current leakage. The ratio of combination is that of the measurement frequency $f_M$ divided by the line frequency of $f_0$.

The outputs from the operational amplifier 33 and the operational amplifier 32 are combined in the above ratio and applied as the input to operational amplifier 71. The operational amplifier 71 has a frequency selective network 72 to provide band pass filtering to suppress harmonics of the 152 Hertz frequency square wave outputs of operational amplifiers 33 and 32. The feedback network 72 will also suppress any 60 Hertz frequency harmonics due to the supply line signal. The network has a low resonance Q to avoid feedback detection errors due to undesirable phase angle drift with temperature changes in the resonating circuit capacitors. It also includes a variable resistor 73 for final adjustment of transmission phase.

The output of operational amplifier 71 is transmitted to the primary of step-up transformer $T_3$ and is amplified approximately 20 times in its secondary to a voltage comparable to that of the supply line voltage. This increase in a voltage output of operational amplifier 71 permits use of the high resistance value 74 which provides a path for introducing the adjustable small measurement current $I_M$ at 152 Hertz into the supply line which can range to a maximum of 6 microamperes and also limits 60 Hertz frequency current leakage added to the circuit by the connection of the LIM to 4 microamperes or less. The 152 Hertz voltage $V_Z$ produced as a result of the flow of the measurement current $I_M$ through all of the leakages to ground in parallel appears superimposed on the floating level of the center tap of the primary of the transformer T2 and is detected by operational amplifiers 62 for transmission through subsequent circuits as a regulating feedback signal to the operational amplifiers 33 and 32 of the commuted integrator circuits 68 and 69.

The voltage at which the center tap of the power transformer T2 floats with respect to ground, is detected by the operational amplifier 62 through high input impedance resistor 61 which draws negligible current to effect the supply isolation. The 60 Hertz line frequency component of this voltage reflects the degree of unbalance of the separate line leakage and as previously explained can vary in magnitude from zero volts with balanced leakages up to ½ of the supply voltage with all leakage in one line, and further, has a phase dependent upon the vector unbalance of hybrid leakages. The considerably smaller high frequency voltage $V_Z$ which reflects the voltage response of the system leakage impedance to the 152 Hertz measurement current generated by the line isolation monitor, is superimposed. Both voltages are reproduced in the output voltage of operational amplifier 62 reduced by the gain of 1 to 12. The input resistor 61 and the feedback resistor of operational amplifier 62 for adjusting the required AC gain (1/12) are preferably of high resistance values so that current drawn by amplifier 62 from the supply may be limited to a few microamperes. In the preferred embodiment, an additional AC feedback path (not shown) is provided to stabilize the amplifiers against DC drift. Alternatively, a high quality stable amplifier may be used to avoid the drift and the requirement for feedback circuits.

The output of the operational amplifier 62 is transmitted through the parallel T filter 76 with components proportioned to block the 60 Hertz line frequency voltage which constitutes the major portion of the floating voltage measured at the center tap of the primary transformer T1. The separation of the small 152 Hertz feedback signal which measures the voltage response of the system leakage impedances $V_Z$ to the measurement current is thereby facilitated. The voltage output of the parallel T filter 76 is supplied to the input of operational amplifier 77 which provides a gain of about 30. The adjustment of the amplification provided by operational amplifier 77 and consequently the entire feedback gain for the generation of the measurement current is provided by resistor 78 and it becomes the means for calibration of the line isolation monitor meter scale. The parallel T filter 76 designed for 60 Hertz null also produces a phase lead of approximately 60° in transmission of the 152 Hertz feedback signal. This 60° phase lead in the feedback signal representing the voltage signal $V_Z$ responsive to the measurement current flow through the system leakage impedances becomes a phase lead of approximately 45° at the output of amplifier 77 due to the amplifier's feedback capacitor 79. This provides a necessary equalizing effect in the detection of the regulating feedback components for the two amplifiers 33 and 32 over the complete range of measured leakages from purely capacitive to purely resistive. In their operation of separately regulating capacitive and resistive components, operational amplifiers 33 and 32 control the magnitude and phase of the measurement current to reflect and match the magnitude and phase requirements of the total system leakage admittance. In this process, they hold the feedback of leakage detected impedance voltage $V_z$ to be proportional in magnitude to the reference voltage V ref. and despite the types of leakage constant in phase. Therefore, the required phase of the feedback signal is necessarily midway between the quadrature phases of commutation to permit each operational amplifier 33 and 32 to detect a phase angle cosine component to oppose the approximately equal reference current supplied. The adjusting resistor 73 in the filter circuitry of amplifier 71 facilitates fine adjustment for the exact phase required.

The amplified 152 Hertz feedback of leakage impedance voltage response $V_z$ phase shifted 45° is present at point 75 in FIG. 2 and is transmitted through low impedance DC blocking capacitors 49 and 48 to provide separately regulating feedback to operational amplifiers 33 and 32. In each of the two operational amplifiers, AC feedback current drawn through its input resistance and forced by the amplifier reaction to flow through its commutated capacitors 31, 37 and 30, 36 is synchronizingly rectified, or phase detected, into opposite polarity DC currents, each equal to the half wave rectified value of the phase component of the feedback current which is synchronized with its commutation. The out-of-phase component received by either amplifier produces zero rectified average current and is instead rectified by the quadrature displaced commutation of the other amplifier. By the proper choice of feedback polarity and phase, these currents oppose the charge currents drawn from the voltage reference V ref. and provide a means of limiting the amplifier output to separately regulated levels.

In the stable regulating condition, the synchronously rectified current component produced as regulated feedback for each amplifier is equal to the rectified value of the voltage output of operational amplifier 77 multiplied by the cosine of the angle of phase difference between its phase and that of the respective commutation for the amplifier and divided by the value of the input resistance of the amplifiers. Therefore, this is automatically regulated by each of the amplifiers to maintain opposing equality to the DC reference current which is determined by the difference between the voltages of the reference source and that of the charged capacitor divided by the value of its resistor. Any discrepancy in difference produces a strong amplifier corrective change in output. This is based on the principal that a low level AC current applied to the AC terminal of a commutating switch can produce a DC voltage and this can be made to oppose a DC current conducted to a terminal of a capacitor. The magnitude of these two opposing signals cancel in the capacitor and can be increased as necessary to provide the required feedback regulating signal without involving extreme excursions of the capacitor voltage. The voltage of the stored capacitor charge then represents an integration of the difference between the two opposing signals.

The commutator integrators 68 and 69 comprising the operational amplifiers 33 and 32 respectively provide a precise comparison of the magnitude of the current produced in response to the impedance voltage $V_z$ however, since the input resistor and capacitor of the operational amplifier circuits are series connected to the voltage reference, the current does not maintain an exact proportionality with the magnitude of the voltage reference, each decreasing somewhat with the rise of the accumulated capacitor charge. Therefore, if additional voltage compensation is not provided, the proper comparison of the system leakage impedance voltage produced in response to the measurement current to that of the reference voltage intended to be the criteria for precise control of separate capacitive and resistive measurement current components would be in error. Thus, if only a resistive leakage is present in the system and measured by output of operational amplifier 32 alone, the amount of resistive voltage feedback detected from the leading phase output of operational amplifier 77 sufficient to balance the reference current produced in response to the V ref. to the charged feedback capacitors of operational amplifier 32 would be insufficient to also balance the greater current drawn from the same reference voltage to the uncharged capacitors of operational amplifier 33 with the equalizing 45° phase angle lead exactly maintained. The operational amplifier 33 would then generate a false leading phase component to correct its balance, the effect of which would tend to advance the 45° phase lead. Similarly, in the measurement of capacitive leakage only by operational amplifier 33, a false lagging phase output of operational amplifier 32 would result. These false outputs could be reduced by increasing gain of other amplifiers, notably operational amplifiers 62 and 71, to permit the operating levels of the operational amplifiers 33 and 32 to be smaller in comparison to the voltage reference and being out-of-phase would not produce excessive error in the summed measurement output for either type of leakage impedance alone. However, during the measurement of hybrid leakage combinations in the supply system, the output of operational amplifiers 33 and 32 would add more directly and cause a significantly lower measurement summation. In the preferred embodiment, the error is compensated for by the addition of a small phase lead in the transmission of the lagging resistive component signal of operational amplifier 32 before it is combined with a capacitive component signal to form the vectorally combined output signal transmitted to operational amplifier 82. This method of compensation is shown by the addition of capacitor 80 in series with the summing resistor 81 which transmits the resistive component to operational amplifier 82.

As an alternative, a more direct compensation for the decrease of reference current produced in response to V ref. with an output rise of the operational amplifiers 33 and 32 could be provided by introducing a small proportional feedback of the AC output voltage of each amplifier to offset the normally grounded noninverting input connection. The proportion of a positive feedback is the same as the ratio of the resistance in the AC input source to the sum of the resistance in the AC input source and the DC reference source resistance. Each operational amplifier 33 and 32 then is forced to draw an additional component of commutated AC input current which exactly compensates for the loss of DC reference current produced in response to the decrease voltage with output rise. With this compensation, both operational amplifiers operate as true integrating voltage comparators, each independently sensing any unbalance error in the magnitude ratio of its phase detected component of AC feedback voltage to the voltage of the DC reference source and reacting with time-delayed, but full correction in the generated component of the current necessary to reduce the comparison error to zero regardless of output level required. The positive voltage feedback could be obtained by the connection of a resistance from the output of each operational amplifier to its grounded noninverting input.

The voltage feedback ratio, indicated above, could theoretically be increased slightly to include compensation for other small degenerating feedbacks present in the operational amplifiers 33 and 34. These degenerating feedbacks are the AC negative feedbacks through the DC stabilizing resistors not completely by-passed by the input capacitors and the lack of infinite gain in the operational amplifiers. However, the additional adjustment and compensation is insignificant and practically not necessary.

With the operational amplifiers 33 and 32 thus compensated to respond to the impedance voltage feedback, the signal transmitted to them in common can then maintain a constant phase angle exactly midway between the quadrature phases of commutation, and also constant proportionally in magnitude to the reference voltage. When the feedback signal is adjusted to provide the necessary 45° phase lead, the leakage impedance voltage produced at the supply tap by the measurement current, then maintains zero phase for the resistive components. Thus, regardless of the combination of parallel connected leakages, operational amplifier 32 provides the exact amount of resistive phase current needed to maintain the required zero phase voltage across the resistive elements of the leakages, while operational amplifier 32 provides the 90° leading phase current required by the capacitive leakages at that same voltage, but with this output magnitude corrected to reflect the 60 Hertz frequency compensation and both outputs of the operational amplifiers maintain their ratio as they vary proportionally with the reference voltage.

When the phase angle signal transmission around the leakage impedance measurement circuit is properly adjusted to produce a leading phase angle of 45°, the 152 Hertz quadrature phase outputs of operational amplifier 33 and 32 in addition to providing resistive and capacitive components of the 152 Hertz measurement circuit directly measure the capacitive and resistive components of the 60 Hertz supply line leakage impedance. Therefore when the impedance voltage $V_z$ produced in response to the measurement current flow through the leakages to ground maintains proportionality to the greater supply line conductor voltage to ground, respective output levels of operational amplifiers 33 and 34 are proportional to the maximum hazard current values of their respective components. A direct combination of the outputs of operational amplifiers 33 and 34 provides a vector addition of the components into 152 Hertz signal amplified by operational amplifier 82 whose rectified output current magnitude indicated by the DC LIM meter 83 then predicts the 60 Hertz maximum hazard current fault. A 152 Hertz bandpass filter 84 of high Q is used in the feedback network of operational amplifier 82 since phase angle drift is not an important design consideration. The increased sharpness of the filtering helps to reduce errors due to unwanted rectification of 60 Hertz frequency signal and higher harmonic components in the 152 Hertz measurement signal.

In addition to indicating the maximum hazard current on the meter 83 the LIM has an audible and visual alarm circuit. Amplifier 85 operates as a differential comparator without negative regulating feedback and has its inverting input biased to a positive voltage reference by a voltage divider comprising resistors 86 and 87 to maintain a full negative output signal in the absence of a hazard measurement signal. This output signal is applied to maintain normal energization of the green "safe" lamp and the relay R to hold off the alarm. An increase in the measurement hazard signal over the predetermined 2 milliampere limit permits a voltage to be applied to the complementary noninverting input of amplifier 85 which reverses the differential bias and the output of amplifier 85 to a positive saturated output. With the positive output of amplifier 85, the alarm relay R is de-energized so that its normally closed contacts energize the alarm and the red "unsafe" light is turned on, it is also possible to actuate remote audible alarms if desired. A positive feedback path can be added to amplifier 85 to maintain the alarm condition once actuated until the hazard decreases to a lesser value than the predetermined 2 ma alarm condition and thereby eliminate intermittent sounding of the alarm.

A negative terminal of the LIM hazard meter 83 is connected to a meter ground point separate from the common LIM ground. A current flow to produce a hazard indication on the meter then must flow through both ground connections. In the event of failure of either of those ground connections, which would normally cause unnoted loss of the operation of the hazard meter 83, a 12 microamperes bias current supplied from the 12 volt source V + flows through a bias resistor 88 which is normally diverted through the meter ground will become effective to charge to capacitor 89 and produce an alarm actuation. The combination of an alarm actuation without a hazard current being indicated by the meter serves as a warning of the failure of a proper monitor ground connection.

Testing of the line isolation monitor operation can be effected by the user at any time by depressing a testing switch 90. Upon activation of the testing switch 90 the normally closed contacts open and disconnect the measurement connection of resistors 61 and 74 from the center tap connection of the primary of transformer T2. The switch 90 now connects resistor 92 to the measurement connection of resistors 61 and 74 to provide a fixed test leakage path for detection. The test leakage path is selected to produce a test hazard indicatioon of the LIM meter sufficiently over the milliamp value to also produce test operation of the alarm functions. The release of the test switch removes the fixed test leakage path and the resulting hazard current and reconnects the normal supply monitor operation. Alternately, two sets of normally closed test contacts may be used to isolate the monitor by opening the ground connection instead of the single connection to the line center tap.

The filtering of the operational amplifier 82 output is adequate under normal line voltage disturbances. However, additional harmonic suppression circuitry can be incorporated to minimize the LIM sensitivity to certain unusual sources of line noise. One unusual source of line noise is produced if a phase controlled light dimmer is employed to regulate current to a lamp or other user device drawn from the monitor supply. If the total leakage of the system is otherwise quite low, the leakage capacitance of the light dimmer when properly grounded usually contributes the predominant amount of total leakage present. The aggravated spectrum of harmonic noise on the line generated as the dimmer is phase controlled to reduce the appliance current seriously distorts the voltage detected by the LIM. The noise voltage excursions are carried through the 60 Hertz parallel T filter 76 and are sufficient to drive the operation amplifier 77 to saturation and are transmitted through operational amplifier 82 to produce a false hazard indication. This increase of the indicated hazard is appreciable if other passive monitored leakage in the system is low or if the commutated feedback capacitors are reduced in value to obtain quicker LIM response. To reduce such error, suppression circuitry (not shown) may be added to draw a small amount of the output signal of 77 through a bandpass filter and applied to the feedback summing point of operational amplifier 82.

If the user connects devices having an appreciable leakage capacitance to ground a momentary DC transient disturbance many times the magnitude of the 152 Hertz measurement signal can be produced. This momentary DC transient disturbance signal can be detected and transmitted by operational amplifier 62 to the parallel T filter 76 and then amplified by the operational amplifier 77 to produce a sudden abnormal increase or decrease of the charge on the capacitors in the feedback of the commutated integrator circuit depending on the synchronous moment of the test frequency switching. These charges may then temporarily increase or decrease the proper measurement levels of the capacitive component and the resistive component of the measurement current with the inherent integration delay. Meanwhile, an abnormal increase or decrease in the output of operational amplifier 82 due to the AC signals generated by the commutation of these charges can persist several seconds and falsely indicate a hazard on the meter and actuate the alarm circuitry. An increase in the size of the capacitors in the feedback path of the operational amplifiers forming the commutated integrator will reduce the response to the DC transient signals but will also extend the delay in recovery to the normal levels. To minimize the nuisance of false momentary actuation of the alarm, a transient suppression of amplifier 85 is provided following any sudden change in the measured hazard level. The suppression is produced by conduction of any sudden voltage rise in the rectified hazard voltage output of operational amplifier 82 through a time duration limiting capacitor 94 and diode 96 to prohibit the actuation of differential amplifier 85 by a temporary rise in its opposite polarity input voltage level. A second diode 98 can be provided to similarly depress the response to a downward surge for additional inhibiting during succeeding over swing to the LIM recover.

The false actuation of amplifier 85 and the subsequent sounding of the alarm during operation of high powered radio frequency electrosurgery (BOVIE) equipment can be prevented by connecting to the same diode diodes above a wire loosely coupled to the supply line tap (not illustrated). The penetrating radiated fields produced by the BOVIE equipment can saturate the LIM circuitry with spurious detected signals. In this case the alarm is temporarily deactivated by the direct transmission to amplifier 85 of the radio frequency energy while the meter is permitted to swing unrestrained in response to the unwanted detection of the radiation throughout the remaining measurement circuitry. Thus, the user can be alerted to unavoidable temporary disruption of normal LIM monitor operation without actuation of remote alarm stations.

The line isolation monitor will operate with balanced line leakages to ground and with unbalanced leakages to ground. In the balanced state with equal matched leakages to ground on the two supply conductors L1 and L2, e.g., equal 60K ohm resistive leakages, equal 0.044 mfd. capacitive leakages, or equal hybrid combinations having the same vector magnitude all produce a 2 milliampere hazard current at either line conductor and the voltage at the center tap of the primary of LIM transformer T2 of zero volts. Therefore, the component of the output voltage of operational amplifier 62 reflecting the 60 Hertz component for line voltage unbalanced is zero and the voltage reference due to the voltages at the secondary S2 of transformer T2 is a minimum value of approximately 5 volts.

For the situation of equal 60K ohm resistive leakages on both lines L1 and L2, the driving voltage V ref. causes operational amplifier 32 in the resistive component current measurement channel 5 to produce zero phase current. The output of the operational amplifier 32 increases as the capacitors 30 and 36 charge until the detected cosine 45° proportion of the 45° phased advanced feedback voltage the resistive measurement current produces across the combined total parallel combination of all the leakage impedance to ground, in this case 30K ohms (reduced by the voltage compensation for the decrease in reference current with output rise) exactly opposes the current produced by the reference voltage V ref. The output of operational amplifier 33 in the capacitive component current measurement circuit is held at zero by similar detection of an equal cosine 45° proportion of the feedback which can exactly oppose the undiminished reference current produced by the voltage V ref. Any initial transient rise in the output of operational amplifier 33, such as immediately following the application of the resistive leakage to ground, produces a strong correcting leading phase signal addition to the feedback voltage and regulates operational amplifier 33 back to zero while only temporarily effecting the true resistive measurement by the resistive component channel 5. The output of the resistive component measurement channel transmitted to operational amplifier 82 then proportionally indicates the amount of 60 Hertz hazard current which would result from either the supply line L1 or L2.

If a balanced 0.044 microfarad capacitive leakage equal at 60 Hertz to a 60K ohm resistive leakage are on both lines L1 and L2, the measurement current will be produced by the leading phase output of operational amplifier 33 in the capacitive component current measurement channel 3, but will be increased in the ratio of the frequency of the measurement current $f_M$ divided by the frequency of the line $f_0$. The decreased value of the capacitive reactance at that frequency and its 90° phase lag produces a voltage feedback which will be of the magnitude and same zero phase as was produced by operational amplifier 32 with resistive leakages to ground for regulating both amplifiers. The voltage output of the operational amplifier 33 now increases until the detected proportion of the feedback, modified by the voltage compensation for the decrease in reference current with output raise, opposes the voltage reference V ref. The output of the capacitive component current measurement channel transmitted to operational amplifier 82 without compensation indicates the amount of 60 Hertz current hazard present in either line.

If balanced hybrid leakages are present on the two lines containing equal proportions of capacitive and resistive impedance then the operational amplifiers 33 and 34 generate cooperating outputs to produce the required impedance voltage for feedback to oppose the voltage reference V ref. The output operational amplifier 33 is increased over the output of operational amplifier 32 by the measurement frequency increase ratio $f_M/f_0$ and will indicate the amount of 60 Hertz leading phase current necessary to maintain the 152 Hertz voltage across the capacitive leakages while the operational amplifier 32 output will indicate the amount of zero phase resistive current simultaneously drawn by the resistive leakages for the same voltage. Proportionate amounts of output compensation act to correct the feedback detected by both amplifiers for their decrease in reference current with output, permitting the 45° phase lead and separation of the components to be maintained. The vector combination of the outputs of operational amplifiers 33 and 32 transmitted to operational amplifier 82 indicates the maximum hazard current due to the balanced capacitive and resistive leakages present in the system.

The line isolation monitor will also operate under unbalanced leakage condition to provide an indication of the maximum hazard current. If one of the matched leakages described above is removed so that the 2 milliamp hazards exist but only in the one conductor line, the voltage of the other conductor grounded by its leakage becomes zero and the mid-tap voltage becomes one-half of the supply voltage. The contribution of the 60 Hertz frequency output signal of operational amplifier 62 in combination with the voltage component of the secondary S2 which has the same polarity causes the voltage reference to increase to ten volts. Thus, although the composite system impedance increases, the generated measurement current remains the same magnitude since flowing through the double impedance value of the single leakage it will produce twice the impedance of the feedback voltage $V_z$ and thus, maintains compensating opposition to the doubled voltage reference V ref.

If one of the leakages, described above is only partially decreased, proportionate changes occur both in the reference voltage V ref. and the impedance feedback voltage $V_z$ such that the measurement current again remains the same to reflect the unchanged hazard of the greater leakage. If the leakages of the respective supply lines L1 and L2 are different in kind, one line having only resistive leakage and the other line only having capacitive leakage, with both lines having equal 60K ohm leakage magnitudes, vector addition maintains the 2 millampere indication of hazard exists at both conductor lines. The quadrature impedance response forces the supply center tap voltage to become one-half the supply magnitude voltage with 90° quadrature angle and each conductor the coductor lines floats at a voltage to ground equal to 0.707 of the supply voltage. The voltage reference will then be equal to 0.707 of that produced by a single conductor leakage. The composite of the quadrature system leakage and resulting magnitude of feedback voltage are also then 0.707 of the value for a single leakage and have a 45° phase lag of the hybrid combination. The operational amplifiers 33 and 32 then maintains the regulation of equal quadrature components reflecting the two milliamp hazard which exists at both conductors in their vector combination. If either one of the leakages, capacitive or resistive, is only reduced instead of eliminated compensating equal changes occur both in the reference and the impedance voltage feedback and in the levels of output for operational amplifier 33 and 32 such that the combined output continues to measure the unchanged hazard of greater leakage.

For each of the unlimited variety of distribution of conductor leakages, matched or unmatched in phase angle and equal or unequal vector magnitudes, an analysis of the output levels of operational amplifiers 33 and 32 will produce equalization of the reference voltage V ref. and the impedance feedback voltage $V_z$. In every case, regardless of the complexity of the distribution, the vector combination of the 152 Hertz frequency outputs of operational amplifiers 33 and 34 will measure the greater 60 Hertz frequency line hazard current.

It is to be understood that the present disclosure can be modified or varied by applying current knowledge without departing from the spirit and scope of the novel concepts of the invention.

I claim:

1. A monitor for use with an ungrounded power distribution system with conductor lines having impedance leakages comprising:
   detector means for generating a reference voltage;
   current means responsive to said reference voltage for applying a measurement current to said system;
   feedback means connected to said system for determining the voltage response of said impedance leakages to said measurement current;
   said feedback means connected to said current means for adjusting the phase and magnitude of said measurement current; and
   output means responsive to said current means for indicating the completeness of said system's isolation from ground.

2. A monitor as set forth in claim 1 wherein said detector means is responsive to said system and said reference voltage is proportional to the maximum voltage to ground of any of said conductor lines in said system.

3. A monitor as set forth in claim 2 wherein said detector means comprises:
   a monitor transformer connected to said system and having a tapped primary and tapped secondary winding;
   amplifier means having an input and output with said input connected to said tap of said primary;
   the output of said amplifier means connected to said tap of said secondary;
   rectifying means connected to said secondary winding for combining said output of said amplifier means with the opposite polarity signal across said secondary.

4. A monitor as set forth in claim 1 wherein said current means comprises:
   a capacitive circuit channel for generating a capacitive component of said measurement current; and
   a resistive circuit channel for generating a resistive component of said measurement current.

5. A monitor as set forth in claim 4 further comprising:
   a summation means for combining said capacitive component and said resistive component of said measurement current; and
   means responsive to said summation means for applying said measurement current to said leakage impedances.

6. A monitor as set forth in claim 5 wherein the frequency of said measurement current is different than the frequency of the line current of said system.

7. A monitor as set forth in claim 6 wherein said summation circuit combines said capacitive component at a ratio to compensate for the proportionally variable response of capacitive impedance with frequency whereby said feedback voltage response will represent the voltage response of the capacitive impedance leakage to said different line frequency.

8. A monitor as set forth in claim 4 wherein said capacitive channel and said resistive channel each comprise a commutated integrator circuit.

9. A monitor as set forth in claim 8 wherein said commutated integrator circuit comprises:
an operational amplifier with a feedback path;
subtractive comparison means in said feedback path for generating an input voltage signal to said amplifier representing the difference between said voltage reference and said impedance voltage response;
and switch means in said feedback path for causing said amplifier to produce an AC output signal.

10. A monitor as set forth in claim 9 wherein the conduction of said switch means in each of said commutated integrators is synchronously timed for producing said AC output signal of each of said amplifiers in phase quadrature.

11. A monitor as set forth in claim 4 wherein said output means comprises:
an output summation means for combining said capacitive component of said measurement current and said resistive component of said measurement current;
a meter circuit for receiving said measurement current whereby the maximum magnitude of line current flow through said impedance leakages is indicated,
amplifier means responsive to said output summation means for applying said measurement current to said meter circuit.

12. A monitor as set forth in claim 11 wherein said output means further comprises:
time delay means responsive to said measurement current;
relay means responsive to said time delay means; and
sensory alarm means connected to said relay means.

13. A monitor as set forth in claim 12 wherein said output means further comprises:
transient overload protection means connected between said time delay means and said relay means.

14. A monitor as set forth in claim 13 wherein said output means further comprises:
ground loss detection means connected to said meter circuit whereby loss of said meter circuit ground energizes said alarm means.

15. A monitor as set forth in claim 1 wherein said feedback means comprises:
input means to determine the voltage response of said impedance leakages to said measurement current;
filter means for separating said feedback voltage response from the line voltage of said system and for phase shifting said feedback voltage;
amplifier means connected to said filter means for applying said phase shifted feedback voltage signal to said current means.

16. A monitor as set forth in claim 1 wherein said output means comprises:
a meter circuit for receiving said measurement current whereby the maximum magnitude of fault current flow through said system leakages is indicated.

17. A monitor as set forth in claim 1 wherein the frequency of said measurement current is different than the frequency of the line current of said system.

18. A monitor for indicating the maximum hazard current in an ungrounded power distribution system with conductor lines having leakage impedances comprising:
detector means responsive to said system to generate a reference voltage proportional to the maximum voltage to ground of any of said conductor lines in said system;
current means responsive to said reference voltage for separately generating a capacitive component signal and a resistive component signal, combining said signals to form a measurement current signal and applying said measurement current signal to said system;
feedback means connected to said system for determining the voltage response signal of said leakage impedances to said measurement current signal;
said voltage response signal connected to said current means for adjusting the phase and magnitude of said measurement current; and
output means responsive to said measurement current for indicating said maximum hazard current.

19. A monitor as set forth in claim 18 wherein said current means comprises:
a capacitive circuit channel for generating said capacitive component signal of said measurement current; and
a resistive circuit channel for generating said resistive component signal of said measurement current.

20. A monitor as set forth in claim 19 wherein said capacitive component signal and said resistive component signal are generated in phase quadrature.

21. A monitor as set forth in claim 19 further comprising:
filter means for phase shifting said impedance voltage response signal; and
amplifier means for applying said phase shifted impedance voltage response signal to both said capacitive circuit channel and said resistive circuit channel for respectively adjusting the magnitude of said component signals.

22. A method of monitoring the maximum hazard current of an ungrounded power distribution system with conductor lines having leakage impedance comprising:
generating a reference voltage signal proportional to the maximum voltage to ground of any of said conductor lines of said system;
generating a measurement current signal in response to said reference voltage signal;
applying said measurement current signal across said impedance leakage of said system;
determining the voltage response signal produced across said leakage impedance to said measurement current signal;
applying said voltage response signal to modify the measurement current signal; and
monitoring the magnitude of said measurement current signal whereby the magnitude of said measurement current signal represents said maximum hazard current.

23. A method as set forth in claim 22 wherein generating a measurement current signal comprises:
generating a capacitive component signal of said measurement current signal,
generating a resistive component signal of said measurement current signal; and
combining said capacitive component signal and said resistive component signal to form said measurement current signal.

24. A method as set forth in claim 23 wherein applying said voltage response signal comprises:
separating said impedance voltage response signal from the line voltage signal;
phase shifting said impedance voltage response signal; and
applying said phase shifted voltage response signal to adjust the magnitude of said capacitive component signal and said resistive component signal.

25. Apparatus for monitoring the maximum hazard current of an ungrounded power distribution system with conductor lines having leakage impedances comprising:
detector means for determining the maximum voltage to ground signal of any of said conductor lines of said system;
current means for applying a measurement current across said leakage impedances to produce an impedance voltage signal;
feedback means for detecting said impedance voltage;
circuit means responsive to said detector means and said feedback means for comparing said impedance voltage signal to said maximum voltage to ground signal;
said circuit means connected to said current means for varying said measurement current until said impedance voltage signal times a constant equals said maximum voltage signal; and
output means responsive to said current means for indicating the magnitude of said measurement current times said constant whereby said indicated signal represents said maximum hazard current.

\* \* \* \* \*

UNITED STATES PATENT AND TRADEMARK OFFICE
CERTIFICATE OF CORRECTION

PATENT NO. : 3,976,987
DATED : August 24, 1976
INVENTOR(S) : Ernest G. Anger

It is certified that error appears in the above-identified patent and that said Letters Patent are hereby corrected as shown below:

Abstract, line 10, after "measurement", insert --current--;

Column 5, line 36, "monior" should read --monitor--;

Column 11, line 36, "link" should read --line--;

Column 12, line 43, after "angle", insert --of--;

Column 13, line 29, "tapa of tap" should read --tap of the--;

Column 14, line 13, "voltages" should read --voltage--;

Column 20, lines 44 and 45, "indicatioon" should read --indication--;

Column 20, line 52, "connection" first occurrence should read --connections--;

Column 21, line 55, cancel "diode" and after "diodes" insert --described--;

Column 23, line 25, cancel "the"; and,

Column 23, line 54, before "conductor" insert --of the-- and cancel "the coductor".

Signed and Sealed this

Twenty-third Day of November 1976

[SEAL]

Attest:

RUTH C. MASON
Attesting Officer

C. MARSHALL DANN
Commissioner of Patents and Trademarks